United States Patent
Saji et al.

(10) Patent No.: US 9,590,288 B2
(45) Date of Patent: Mar. 7, 2017

(54) MULTILAYER CIRCUIT SUBSTRATE

(71) Applicant: TAIYO YUDEN CO., LTD., Tokyo (JP)

(72) Inventors: Tetsuo Saji, Tokyo (JP); Hiroshi Nakamura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 20 days.

(21) Appl. No.: 14/701,171

(22) Filed: Apr. 30, 2015

(65) Prior Publication Data

US 2015/0236393 A1  Aug. 20, 2015

Related U.S. Application Data

(63) Continuation-in-part of application No. 14/072,648, filed on Nov. 5, 2013.

(30) Foreign Application Priority Data

Apr. 9, 2013  (JP) ................................ 2013-081237
May 2, 2014  (JP) ................................ 2014-095244

(51) Int. Cl.
  *H01F 3/08*  (2006.01)
  *H01P 3/08*  (2006.01)
  *H01P 3/00*  (2006.01)
  *H05K 1/02*  (2006.01)

(52) U.S. Cl.
  CPC ............... *H01P 3/08* (2013.01); *H01P 3/003* (2013.01); *H05K 1/0253* (2013.01)

(58) Field of Classification Search
  CPC ......... H05K 1/0253; H05K 2201/0776; H05K 2201/0792; H01P 5/028; H01P 3/088
  USPC ............... 333/12, 116, 246, 161, 1; 174/251
  See application file for complete search history.

(56) References Cited

U.S. PATENT DOCUMENTS

| 3,104,363 A |   | 9/1963 | Butler |
|---|---|---|---|
| 4,675,620 A |   | 6/1987 | Fullerton |
| 4,732,445 A | * | 3/1988 | Sabatier ................ G02F 1/3134 385/27 |
| 5,428,327 A |   | 6/1995 | Bahl |
| 5,939,952 A | * | 8/1999 | Noda ................... H01B 7/0876 174/250 |

(Continued)

FOREIGN PATENT DOCUMENTS

| JP | 2002-368507 A | 12/2002 |
|---|---|---|
| JP | 2011-055328 A | 3/2011 |

*Primary Examiner* — Steven T Sawyer
(74) *Attorney, Agent, or Firm* — Chen Yoshimura LLP

(57) ABSTRACT

A multilayer circuit substrate includes: a first signal line and a first ground conductor formed in a first conductive layer; and a second signal line and a second ground conductor formed in a second conductive layer, the second conductive layer facing the first conductive layer across an insulating layer. The first signal line intersects with the second signal line in a plan view of the multilayer circuit substrate, a space between the first ground conductor and first signal line is smaller in an intersection area of the first and second signal lines than a space in a non-intersection area, a space between the second ground conductor and second signal line is smaller in the intersection area than a space in the non-intersection area, and the first signal line is formed at a smaller line width in the intersection area than in the non-intersection area.

8 Claims, 7 Drawing Sheets

(56) References Cited

U.S. PATENT DOCUMENTS

| | | | |
|---|---|---|---|
| 6,043,556 A | 3/2000 | Tomie | |
| 6,677,832 B1 * | 1/2004 | Guinn | H01P 3/003 333/116 |
| 7,212,088 B1 | 5/2007 | Norregaard | |
| 8,274,307 B1 | 9/2012 | Ben | |
| 2005/0116792 A1 * | 6/2005 | Moon | H01P 3/003 333/161 |
| 2009/0071702 A1 | 3/2009 | Lin et al. | |

* cited by examiner

MULTILAYER CIRCUIT SUBSTRATE

This application is a Continuation-in-Part application of a pending application, application Ser. No. 14/072,648, filed on Nov. 5, 2013, which is hereby incorporated by reference in its entirety. The present application claims the benefit of the prior Japanese Patent Applications No. 2013-081237, filed in Japan on Apr. 9, 2013, and No. 2014-95244, filed in Japan on May 2, 2014, the entire contents of which are hereby incorporated by reference.

BACKGROUND OF THE INVENTION

Field of the Invention

The present invention relates to a multilayer circuit substrate formed by stacking insulating layers and conductive layers, and particularly relates to a high frequency signal transmission technology.

Description of Related Art

It is well-known that technology such as strip lines, microstrip lines, and coplanar lines are used for high frequency signal transmission technology in multilayer circuit substrates having high frequency circuits. When two transmission lines intersect in such a multilayer circuit substrate, signal lines are formed in different conductive layers at least at each intersection area of these signal lines, which correspond to the center conductor of each transmission line. A structure is disclosed in Patent Document 1 in which two microstrip line structures are combined together in a simple manner. In this structure, a ground conductor of the first microstrip line is placed between a signal line of the first microstrip line and a signal line of the second microstrip line. In Patent Document 2, a structure is disclosed in which the signal lines of the first and second microstrip lines are each formed on the surface of the multilayer circuit substrate, and the ground conductor is formed on the bottom of the multilayer circuit substrate. In other words, the first and second microstrip lines use a common ground conductor. At the intersection area of these microstrip lines, the signal line of the first microstrip line is formed inside the multilayer circuit substrate, and both ends of the signal line are connected to a signal line on the surface layer via a through-hole.

RELATED ART DOCUMENTS

Patent Documents

Patent Document 1: Japanese Patent Application Laid-Open Publication No. 2002-368507
Patent Document 2: Japanese Patent Application Laid-Open Publication No. 2011-055328

SUMMARY OF THE INVENTION

Following the need for a reduction in size and thickness and more functionality in recent electronics, the need has become greater for a further reduction in thickness of the multilayer circuit board and a narrower pitch between the wiring lines. However, when transmitting high frequency signals in a multilayer circuit substrate, discontinuity of characteristic impedance in the transmission lines becomes a problem. This causes reflection of the high frequency signal at the part where discontinuity occurs, which results in damage to the transmission signal and distortion and corruption of the waveforms and the like. In addition, when transmission lines intersect on a multilayer circuit substrate as described above, signal interference between the transmission lines becomes a problem.

To address this problem, the configuration disclosed in Patent Document 1 has a ground conductor between a signal line of a first microstrip line and a signal line of a second microstrip line. While isolation of the transmitted signals can be ensured, this configuration is not suitable for a reduction in thickness due to a formation layer for the ground conductor always being necessary.

Meanwhile, the configuration disclosed in Patent Document 2 places a parallel resonance circuit at an area where the transmission lines intersect each other. The parallel resonance circuit resonates at the used frequency, and ensures isolation in the resonance frequency. Such a configuration contributes to a reduction in thickness because it is not necessary to place a ground conductor between the transmission lines. However, since the lines are being connected through inductors by the wiring lines, if the resonance frequency falters, then there is a problem that isolation worsens. The wiring lines and insulating layers of the multilayer circuit substrate form inductors and capacitors, so variations arising during manufacturing can lead to variations in the resonance frequency, and thus, it is hard to ensure uniform isolation. Furthermore, there is the problem that this configuration cannot be adopted if signal frequencies between the transmission lines differ.

The present invention was made in view of the above situation, and aims at providing a multilayer circuit substrate having an intersection configuration for the transmission lines in which good high frequency characteristics and a reduction in thickness can be achieved with ease.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present invention is a multilayer circuit substrate formed by stacking insulating layers and conductive layers, including: a first signal line and a first ground conductor spaced apart from the first signal line formed in a first conductive layer; and a second signal line and a second ground conductor spaced apart from the second signal line formed in a second conductive layer, the second conductive layer facing the first conductive layer across an insulating layer, wherein the first signal line intersects the second signal line in a plan view of the multilayer circuit substrate, wherein a space between the first ground conductor and first signal line is smaller in an intersection area of the first and second signal lines than a space in a non-intersection area, wherein a space between the second ground conductor and second signal line is smaller in the intersection area than a space in the non-intersection area, wherein the first signal line is formed at a smaller line width in the intersection area than in the non-intersection area, and wherein the second signal line has the same line width throughout the intersection area and the non-intersection area.

According to this aspect of the present invention, in the non-intersection area of the first signal line and second signal line, a microstrip line can be formed by the first signal line formed in the first conductive layer and the second ground conductor formed in the second conductive layer, and a microstrip line can be formed from the second signal line formed in the second conductive layer and the first ground conductor formed in the first conductive layer. At the same time, in the intersection area of the first signal line and second signal line, a coplanar line can be formed by the first signal line and first ground conductor formed in the first conductive layer, and a coplanar line can be formed by the second signal line and second ground conductor formed in the second conductive layer. This enables a reduction in thickness of a multilayer circuit substrate that has an intersection configuration for transmission lines. Furthermore, the respective ground conductors are placed in the vicinity of and in the same layer as the respective signal lines, and thus, there is low susceptibility for the coplanar lines to be influenced by signal lines and ground conductors formed in other layers. In this way, the isolation of the first signal line and second signal line can be ensured with ease.

In one example of a preferred aspect of the present invention, the space between the first ground conductor and first signal line is set such that, in the intersection area of the first and second signal lines, the first ground conductor contributes more to characteristic impedance of the first signal than the second ground conductor, and in the non-intersection area the distance with the second ground conductor contributes more than the distance with the first ground conductor, and the space between the second ground conductor and second signal line is set such that, in the intersection area of the first and second signal lines, the second ground conductor contributes more to characteristic impedance of the second signal line than the first ground conductor, and in the non-intersection area the first ground conductor contributes more to characteristic impedance than the second ground conductor.

In another example of a preferred aspect of the present invention, the first signal line has the same characteristic impedance in the non-intersection area as in the intersection area of the first signal line and the second signal line, and the second signal line has the same characteristic impedance in the non-intersection area as in the intersection area of the first signal line and the second signal line.

In another example of a preferred aspect of the present invention, the first signal line has the same characteristic impedance in the non-intersection area as in the intersection area of the first signal line and the second signal line, and the second signal line has the same characteristic impedance in the non-intersection area as in the intersection area of the first signal line and the second signal line.

As described above, the multilayer circuit substrate of the present invention can achieve good high frequency characteristics and a reduction in thickness with ease while having an intersection configuration for the transmission lines.

It is to be understood that both the foregoing general description and the following detailed description are exemplary and explanatory, and are intended to provide further explanation of the invention as claimed.

DETAILED DESCRIPTION OF THE PREFERRED EMBODIMENTS (Embodiment 1)

Figure 1A:
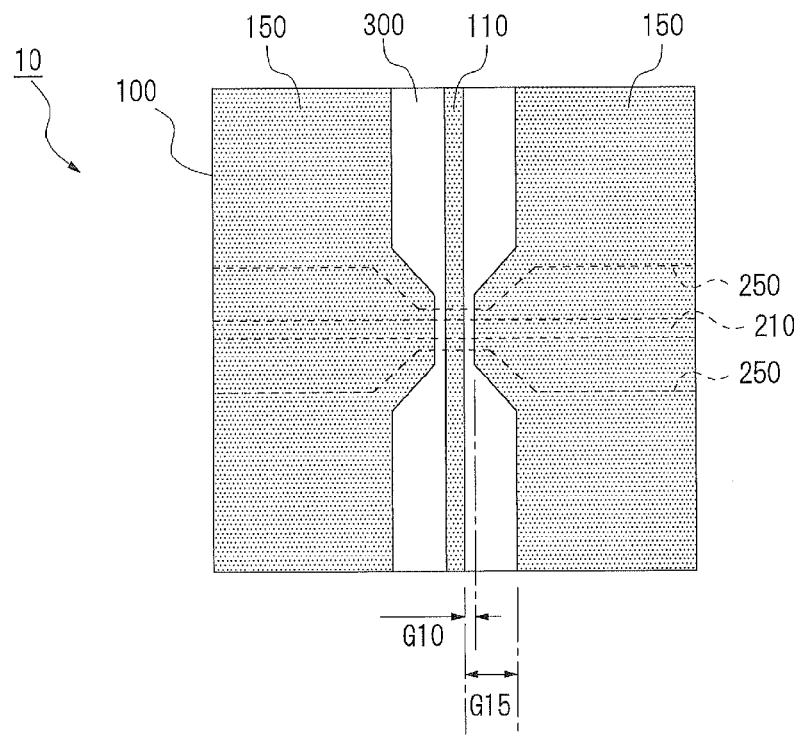
FIGS. 1A and 1B show surface views of a front surface and a rear surface, respectively, of a multilayer circuit substrate according to Embodiment 1.
Figure 1B:
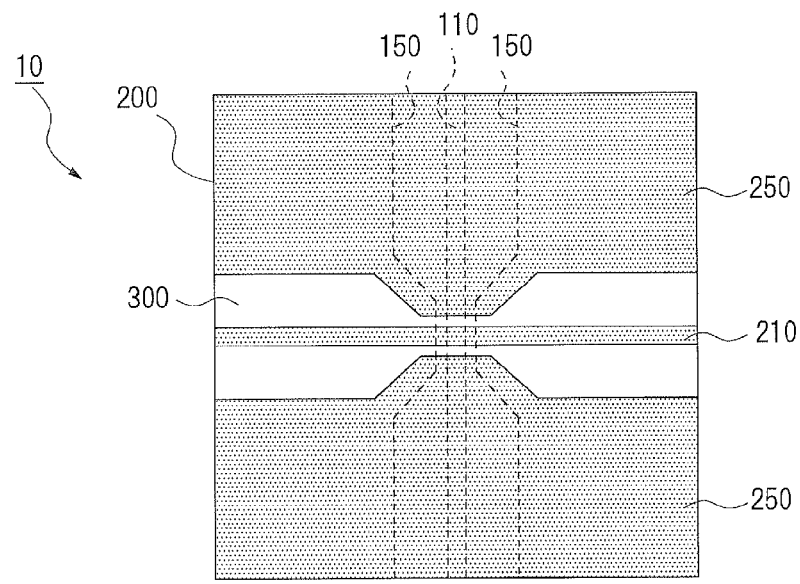

An intersection configuration of a multilayer circuit substrate according to Embodiment 1 of the present invention will be explained with reference to figures. FIGS. 1A and 1B are surface views of the front surface and the rear surface, respectively, of the multilayer circuit substrate. FIG. 1A is a front surface view as viewed from a top of the multilayer circuit substrate, and FIG. 1B is a rear surface view as viewed from a bottom of the multilayer circuit substrate.

As shown in FIGS. 1A and 1B, a multilayer circuit substrate 10 of the present embodiment is a double-sided substrate with a conductive layer 100 and 200 formed on both respective surfaces of a single insulating layer. In other words, the first conductive layer 100 is formed on the top of the multilayer circuit substrate 10, and the second conductive layer 200 is formed on the bottom, with an insulating layer 300 being formed between the conductive layers 100 and 200. As shown in FIG. 1A, a first signal line 110 for transmitting a high frequency signal, and a first ground conductor 150 formed spaced apart from the first signal line 110, are formed in the conductive layer 100. The first ground conductor 150 is a so-called "ground plane" ground conductor that is formed in all regions except the regions with necessary wiring lines (including the first signal line 110), lands, through-holes, terminal electrodes, and the like for the high frequency circuit formed by the multilayer circuit substrate 10. In a similar manner, as shown in FIG. 1B, a second signal line 210 for transmitting a high frequency signal, and a second ground conductor 250 formed spaced apart from the second signal line 210, are formed in the second conductive layer 200. The second ground conductor 250 is a so-called "ground plane" ground conductor that is formed in all regions except the regions with necessary wiring lines (including the second signal line 210), lands, through-holes, terminal electrodes, and the like for the high frequency circuit formed by the multilayer circuit substrate 10. The first ground conductor 150 and second ground conductor 250 are electrically connected by a through-hole (not shown).

In the multilayer circuit substrate 10 according to Embodiment 1 of the present invention, the first signal line 110 intersects the second signal line 210 in a plan view of the multilayer circuit substrate 10. A feature of the present embodiment is a configuration of the first conductive layer 100 and second conductive layer 200 at the intersection area of the first signal line 110 and the second signal line 210. The first conductive layer 100 and second conductive layer 200 have a common configuration, and thus, only the first conductive layer 100 will be explained.

As shown in FIG. 1A, a space G10 between the first signal line 110 and first ground conductor 150 formed in the first conductive layer 100 in the intersection area between the first signal line 110 and the second signal line 210 is smaller than a space G15 between the first signal line 110 and first ground conductor 150 in the non-intersection area. Specifically, the width of the first signal line 110 is uniform. The edge of the first ground conductor 150 facing the first signal line 110 gradually approaches the first signal line 110 the closer the first ground conductor 150 is to the intersection, and the ground conductor 150 is formed jutting out in the vicinity of the intersection as to be the space G15 between the first ground conductor 150 and the first signal line 110. In other words, near the intersection area, the first ground conductor 150 is formed jutting out in a trapezoidal shape along the direction of the first signal line 110.

The first signal line 110, except for the portion intersecting the second signal line 210, forms an internal conductor of the microstrip line by the relationship of the first signal line 110 with the second ground conductor 250 formed in the second conductive layer 200. In other words, at the non-intersection area, the dimensions and the like of respective parts are configured such that the characteristic impedance of the first signal line 110 is more dominant at a distance, namely the thickness of the insulating layer 300, with the second ground conductor 250 formed in the second conductive layer 200 than the space G10 with the first ground conductor 150 formed in the first conductive layer 100. The first signal line 110, at the intersection area with the second signal line 210, forms an internal conductor of the coplanar line by the relationship with the first ground conductor 150 formed in the first conductive layer 100. In other words, at the intersection area, the dimensions and the like of the respective parts are configured such that the characteristic impedance of the first signal line 110 is more dominant at the space G15 with the first ground conductor 150 formed in the first conductive layer 100 than at a distance, namely the thickness of the insulating layer 300, with the second ground conductor 250 formed in the second conductive layer 200.

According to the multilayer circuit substrate 10 of the present embodiment, there is only an insulating layer 300 between the first conductive layer 100 in which the first signal line 110 is formed and the second conductive layer 200 in which the second signal line 210 is formed, and thus, a reduction in thickness can be achieved with ease. Furthermore, the ground conductors 150 and 250 are placed at the intersection area in the vicinity of and in the same layer as the respective signal lines 110 and 210, and thus, there is low susceptibility to influence from signal lines and ground conductors formed in other layers. In this way, the isolation of the first signal lines 110 and the second signal line 210 can be ensured with ease.

(Embodiment 2)

Figure 2A:
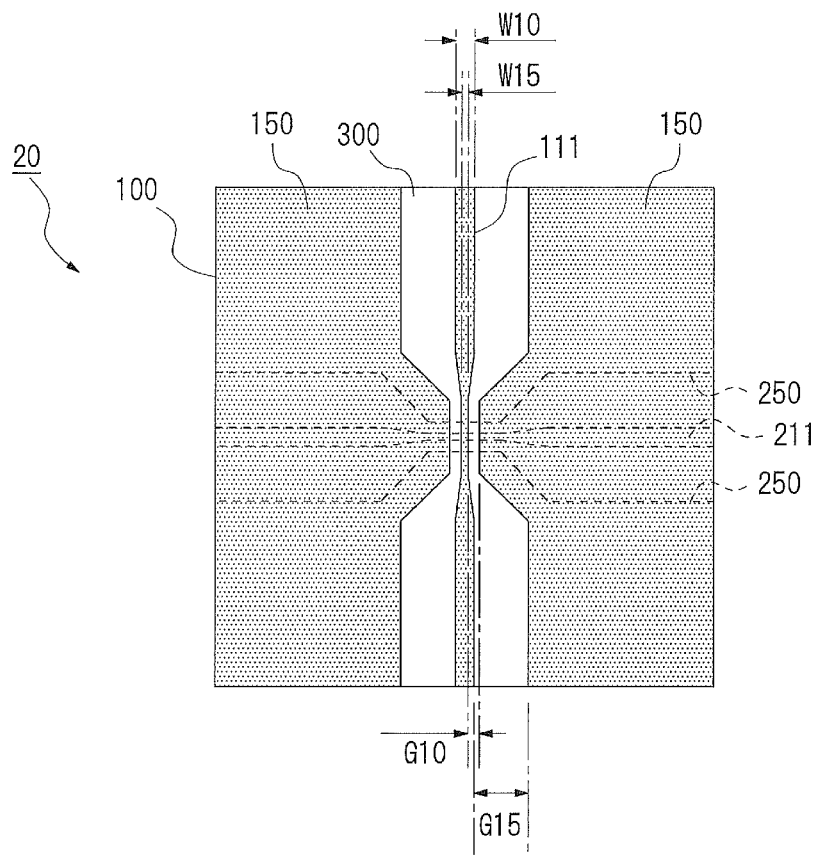
FIGS. 2A and 2B show surface views of a front surface and a rear surface, respectively, of a multilayer circuit substrate according to Embodiment 2.
Figure 2B:
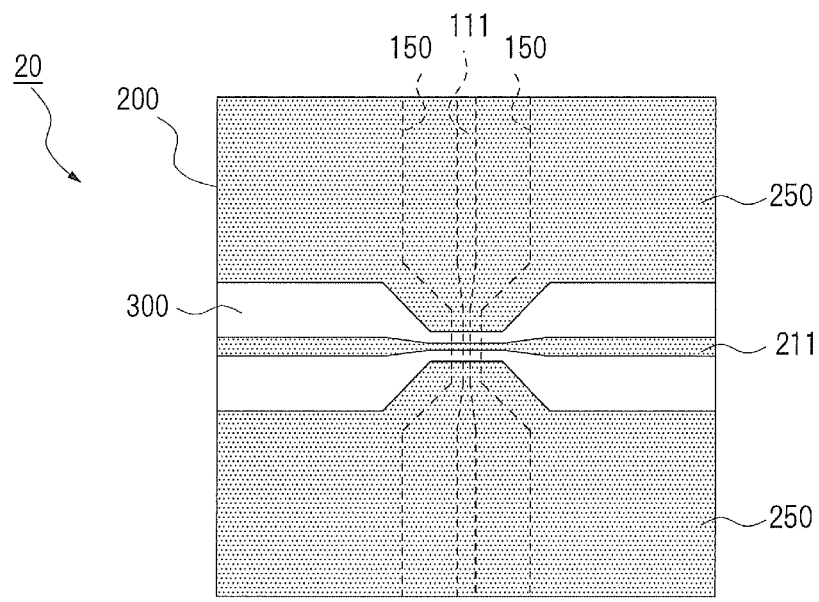

A multilayer circuit substrate according to Embodiment 2 of the present invention will be explained with reference to figures. FIGS. 2A and 2B are surface views of the front surface and rear surface, respectively, of the multilayer circuit substrate. FIG. 2A is a front surface view as viewed from a top surface of the multilayer circuit substrate, and FIG. 2B is a rear surface view as viewed from a bottom surface of the multilayer circuit substrate.

A multilayer circuit substrate 20 according to Embodiment 2 differs from the multilayer circuit substrate 10 of Embodiment 1 in the configuration of a first signal line 111 and a second signal line 211. The first conductive layer 100 and second conductive layer 200 have a common configuration, and therefore, only the first conductive layer 100 will be explained.

As shown in FIG. 2A, first signal line 111 has a width W15 outside of the intersection area of the first signal line 111 and second signal line 211 that becomes narrower as it approaches the intersection area, such that the first signal line 111 has a width W10 that is smaller than the width W15.

In a similar manner to Embodiment 1, a space G10 between the first signal line 111 and first ground conductor 150 formed in the first conductive layer 100 is smaller than a space G15 between the first signal line 111 and first ground conductor 150 in a non-intersection area. Specifically, the edge of the first ground conductor 150 facing the first signal line 111 gradually approaches the first signal line 111 the closer the first ground conductor 150 is to the intersection area, and juts out to become the space G15 with the first signal line 111 in the vicinity of the intersection area. In other words, in the vicinity of the intersection area the first ground conductor 150 is formed jutting out in a trapezoidal shape along the direction of the first signal line 111.

The first signal line 111, except for the portion intersecting the second signal line 211, forms an internal conductor of the microstrip line by the relationship of the first signal line 111 with the second ground conductor 250 formed in the second conductive layer 200. In other words, at the non-intersection area, the dimensions and the like of every part are configured such that the characteristic impedance of the first signal line 111 is more dominant at a distance, namely the thickness of the insulating layer 300, with the second ground conductor 250 formed in the second conductive layer 200 than the space G10 with the first ground conductor 150 formed in the first conductive layer 100. The first signal line 111, at the intersection area with the second signal line 211, forms an internal conductor of the coplanar line by the relationship with the first ground conductor 150 formed in the first conductive layer 100. In other words, at the intersection area, the dimensions and the like of the respective parts are configured such that the characteristic impedance of the first signal line 111 is more dominant at the space G15 with the first ground conductor 150 formed in the first conductive layer 100 than at a distance, namely the thickness of the insulating layer 300, with the second ground conductor 250 formed in the second conductive layer 200. The dimensions and the like of the respective parts are configured such that the characteristic impedance of the first signal line 111 will be entirely uniform, or in other words such that discontinuity of characteristic impedance will not occur, regardless of whether the area is the intersection area of the first signal line 111 and the second signal line 211 or the non-intersecting area.

According to the multilayer circuit substrate 10 of the present embodiment, there is only an insulating layer 300 between the first conductive layer 100 in which the first signal line 111 is formed and the second conductive layer 200 in which the second signal line 211 is formed, and thus, a reduction in thickness can be achieved with ease, in a manner similar to Embodiment 1. By adjusting the space and the like between the respective signal lines 111 and 211 and the respective ground conductors 150 and 250, the occurrence of discontinuity of the characteristic impedance can be prevented with ease. When both signal lines at the intersection area of the first signal line 111 and the second signal line 211 have the same width as portions of the lines in the non-intersection area as in Embodiment 1, then the characteristic impedance of the intersection area becomes lower than the characteristic impedance of the non-intersection area. In particular, in the present embodiment the line width of both signal lines at the intersection area of the first signal line 111 and the second signal line 211 is smaller than in non-intersection areas, and thus, compared to Embodiment 1, the characteristic impedance can be made entirely uniform with ease, regardless of whether the area is an intersection area or non-intersection area. Furthermore, the ground conductors 150 and 250 are placed at the intersection area in the vicinity of and in the same layer as the respective signal lines 111 and 211, and thus, there is low susceptibility to influence from signal lines and ground conductors formed in other layers. In this way, the isolation of the first signal lines 111 and the second signal line 211 can be ensured with ease. The line width of both signal lines at the intersection area of the first signal line 111 and the second signal line 211 is smaller than in non-intersection areas, and thus, compared to Embodiment 1, isolation between both signal lines can be further secured with ease.

(Embodiment 3)

Figure 5A:
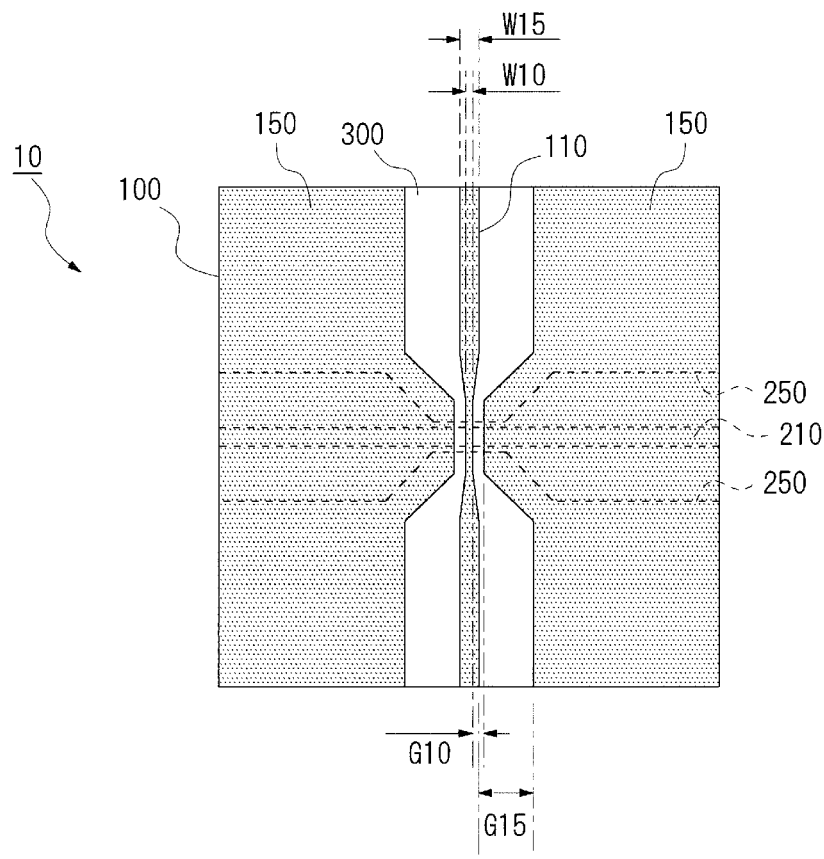
FIGS. 5A and 5B show surface views of a front surface and a rear surface, respectively, of a multilayer circuit substrate according to Embodiment 3.
Figure 5B:
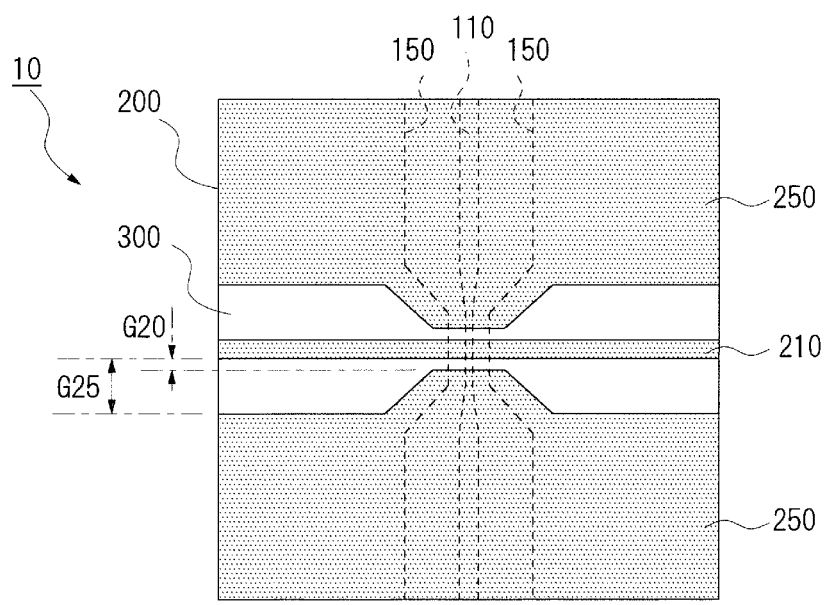

An intersection configuration of a multilayer circuit substrate according to Embodiment 3 of the present invention will be explained with reference to figures. FIGS. 5A and 5B are surface views of the multilayer circuit substrate. FIG. 5A is a surface view as viewed from a top of the multilayer circuit substrate, and FIG. 5B is a surface view as viewed from a bottom of the multilayer circuit substrate.

As shown in FIGS. 5A and 5B, a multilayer circuit substrate 10 of the present embodiment has conductive layers and insulating layers stacked together, with a conductive layer 100 and 200 formed on both respective surfaces of a single insulating layer. In other words, the first conductive layer 100 is formed on the top of the multilayer circuit substrate 10, and the second conductive layer 200 is formed on the bottom, with an insulating layer 300 being formed between the conductive layers 100 and 200. As shown in FIG. 5A, a first signal line 110 for transmitting a high frequency signal, and a first ground conductor 150 formed spaced apart from the first signal line 110, are formed in the conductive layer 100. The first ground conductor 150 is a so-called "ground plane" ground conductor that is formed in all regions except the regions with necessary wiring lines (including the first signal line 110), lands, through-holes, terminal electrodes, and the like for the high frequency circuit formed by the multilayer circuit substrate 10. In a similar manner, as shown in FIG. 5B, a second signal line 210 for transmitting a high frequency signal, and a second ground conductor 250 formed spaced apart from the second signal line 210, are formed in the second conductive layer 200. The second ground conductor 250 is a so-called "ground plane" ground conductor that is formed in all regions except the regions with necessary wiring lines (including the second signal line 210), lands, through-holes, terminal electrodes, and the like for the high frequency circuit formed by the multilayer circuit substrate 10. The first ground conductor 150 and second ground conductor 250 are electrically connected by a through-hole (not shown).

In the multilayer circuit substrate 10 according to this embodiment of the present invention, the first signal line 110 intersects the second signal line 210 in a plan view of the multilayer circuit substrate 10. A feature of the present embodiment is a configuration of the first conductive layer 100 and second conductive layer 200 at the intersection area of the first signal line 110 and the second signal line 210. Another feature of the present embodiment is the structure of the first signal line 110 at the intersection of the first signal line 110 and the second signal line 210.

As shown in FIG. 5A, first signal line 110 has a uniform width W15 outside of the intersection area of the first signal line 110 and second signal line 210 that becomes narrower as it approaches the intersection area, such that the first signal line 110 has a width W10 that is smaller than the width W15 in the intersection area and in the vicinity thereof. Furthermore, a space G10 between the first signal line 110 and first ground conductor 150 formed in the first conductive layer 100 is smaller than a space G15 between the first signal line 110 and first ground conductor 150 in a non-intersection area. Specifically, the edge of the first ground conductor 150 facing the first signal line 110 gradually approaches the first signal line 110 the closer the first ground conductor 150 is to the intersection area, and juts out to become the space G15 with the first signal line 110 in the vicinity of the intersection area. In other words, in the vicinity of the intersection area the first ground conductor 150 is formed jutting out in a trapezoidal shape along the direction of the first signal line 110. The location where the jutting out of the first ground conductor 150 begins approximately corresponds with the location where the width of the first signal line 110 becomes to decrease in the length direction of the first signal line 110.

Furthermore, in a similar manner to the first signal line 110, a gap G20 between the second signal line 210 formed in the second conductive layer 200 and the second ground conductor 250 in the intersection area is smaller than a gap G25 between the second signal line 210 and the second ground conductor 250 in the non-intersection area. The second signal line 210, however, differs from the first signal line 110 by having an identical (uniform) line width at least from the intersection area with the first signal line 110 to across the non-intersection area, or namely, by having this uniform line width from the intersection area from front to back in the length direction of the second signal line 210. On the other hand, in a similar manner to the first ground conductor 150, the edge of the second ground conductor 250 facing the second signal line 210 juts out so as to become progressively closer to the second signal line 210 approaching the intersection area and so as to form the gap G25 relative to the second signal line 210 in the vicinity of the intersection area. In other words, the second ground conductor 250 juts out so as to form a trapezoidal shape relative to the direction of the second signal line 210 in the vicinity of the intersection area.

The first signal line 110, except for the portion intersecting the second signal line 210, forms an internal conductor of the microstrip line by the relationship of the first signal line 110 with the second ground conductor 250 formed in the second conductive layer 200. In other words, at the non-intersection area, the dimensions and the like of respective parts are configured such that the characteristic impedance of the first signal line 110 is more dominant at a distance, namely the thickness of the insulating layer 300, with the second ground conductor 250 formed in the second conductive layer 200 than the space G10 with the first ground conductor 150 formed in the first conductive layer 100. The first signal line 110, at the intersection area with the second signal line 210, forms an internal conductor of the coplanar line by the relationship with the first ground conductor 150 formed in the first conductive layer 100. In other words, at the intersection area, the dimensions and the like of the respective parts are configured such that the characteristic impedance of the first signal line 110 is more dominant at the space G15 with the first ground conductor 150 formed in the first conductive layer 100 than at a distance, namely the thickness of the insulating layer 300, with the second ground conductor 250 formed in the second conductive layer 200. Moreover, the dimensions and the like of the respective parts are configured such that the characteristics impedance of the first signal line 110 becomes uniform throughout, without regard for the intersection area with the second signal line 210 and the non-intersection area, or namely, configured so there are no non-continuous parts with respect to characteristic impedance. The features concerning the characteristic impedance as described above are similar for the second signal line 210.

According to the multilayer circuit substrate 10 of the present embodiment, there is only an insulating layer 300 between the first conductive layer 100 in which the first signal line 110 is formed and the second conductive layer 200 in which the second signal line 210 is formed, and thus, a reduction in thickness can be achieved with ease. Furthermore, the gaps and the like between the respective signal lines 110 and 210 and the respective ground conductors 150 and 250 can be adjusted to facilitate prevention of non-continuity with respect to characteristic impedance. In particular, in the present embodiment, the line width of the first signal line 110 becomes narrower than the non-intersection area at the intersection area of the first signal line 110 and the second signal line 210; therefore, characteristic impedance of the first signal line 110 can be made uniform throughout with ease, without regard to intersection area or non-intersection area.

According to the multilayer circuit substrate 10 of the present embodiment, the respective ground conductors 150 and 250 are placed at the intersection area in the vicinity of and in the same layer as the respective signal lines 110 and 210, and thus, there is low susceptibility to influence from signal lines and ground conductors formed in other layers. In this way, the isolation of the first signal lines 110 and the second signal line 210 can be ensured with ease. In particular, in the present embodiment, the line width of the first signal line 110 becomes narrower in the intersection area of the first signal line 110 and the second signal line 210 than in the non-intersection area, and thus it is even easier to maintain the isolation between the signal lines.

Embodiments of the present invention were described in detail above, but the present invention is not limited thereto. In each embodiment above, a double-sided substrate in which a conductive layer is formed on both sides of a single insulating layer was described, but the present invention is applicable even if a multilayer circuit substrate that has three or more conductive layers containing a conductive surface layer is used, for example. In this case, the conductive layer facing the single insulating layer across the insulating layer is equivalent to the first conductive layer and second conductive layer of the present invention. In such a case, one of either the first conductive layer or the second conductive layer may be the surface layer of the multilayer circuit substrate, or both layers may be inside the multilayer circuit substrate.

EXAMPLES

Examples of the embodiments were tested for pass characteristics and isolation using a simulation. Example A has the configuration described in Embodiment 1 above. Example B has the configuration described in Embodiment 2 above. Example C has the configuration described in Embodiment 3 above. In Example A, the line length of a first and second signal line is 5 mm, the width thereof is 85 μm, the thickness thereof is 13 μm, the thickness of an insulating layer is 44 μm, the space between the respective signal lines and a ground conductor at a non-intersection area is 170 μm, and the space between the respective signal lines and the ground conductor at an intersection area is 38 μm. In example B, the line length of a first and second signal line is 5 mm, the thickness thereof is 13 μm, the width of the respective signal lines at a non-intersection area is 85 μm, the width of the respective signal lines at an intersection area is 56 μm, the thickness of an insulating layer is 44 μm, the space between the respective signal lines and the ground conductor at the non-intersection area is 170 μm, and the space between the respective signal lines and the ground conductor at the intersection area is 25 μm. In Example C, the line length of the first signal line is 5 mm, the thickness thereof is 13 μm, the width of the first signal line at the non-intersection area is 85 μm, the width of the first signal line at the intersection area is 56 μm, the space between the first signal line and the ground conductor in the non-intersection area is 170 μm, and the space between the first signal line and the first ground conductor in the intersection area is 25 μm. Furthermore, in Example C, the line length of the second signal line is 5 mm, the width thereof is 85 μm throughout, the thickness thereof is 13 μm, the spacing between the second signal line and the second ground conductor in the non-intersection area is 170 μm, and the spacing between the second signal line and the second ground conductor in the intersection area is 38 μm. Moreover, in Example C, the thickness of the insulating layer is 44 μm.

An example using a microstrip line as the first and second transmission lines is used for Comparison Example 1. In Comparison Example 1, the line length of the first and second signals lines is 5 mm, the width thereof is 85 μm, the thickness thereof is 13 μm, the thickness of an insulating layer is 44 μm, and the space between the respective signal lines and a ground conductor is 170 μm.

An example using a coplanar line as the first and second transmission lines is used for Comparison Example 2. In Comparison Example 2, the line length of the first and second signal lines is 5 mm, the width thereof is 56 μm, the thickness thereof is 13 μm, the thickness of an insulating layer is 44 μm, and the space between the respective signal lines and a ground conductor is 25 μm.

In Examples A-C and Comparison Examples 1 and 2, one end of the first signal line is a port 1, the other end thereof is a port 2, an end of the second signal line is a port 3, and the other end thereof is a port 4. A sine wave from 1 GHz to 6 GHz is applied between the port 1 and the port 2, and a prescribed load (impedance element) is connected to the port 3 and the port 4. In these conditions, S21, which is one S parameter for a value of pass characteristics, and S41, which is a value of isolation, are sought. FIGS. 3, 4, 6, and 7 show the simulation results.

Figure 3:
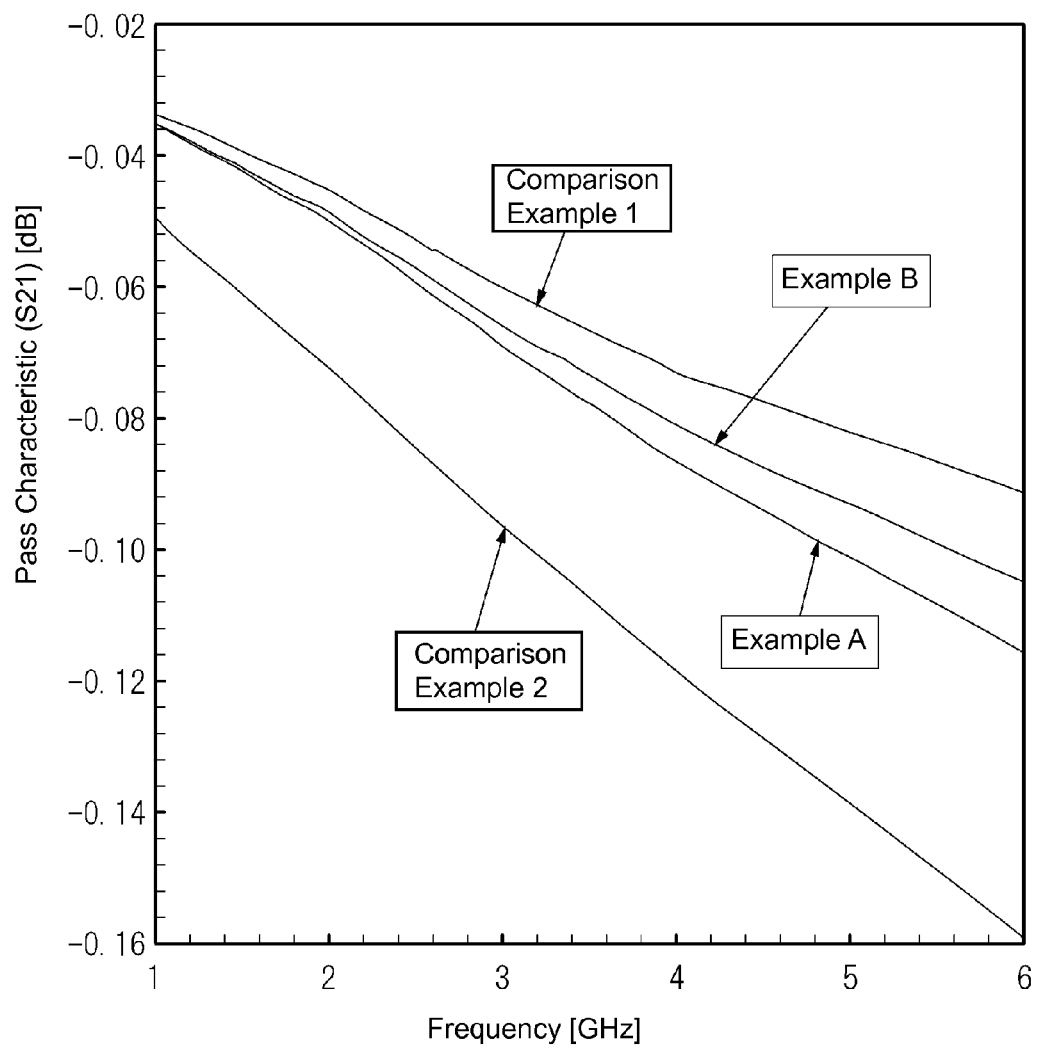
FIG. 3 shows results from pass characteristic simulations of Examples A and B, which are examples of Embodiments 1 and 2, respectively.
Figure 4:
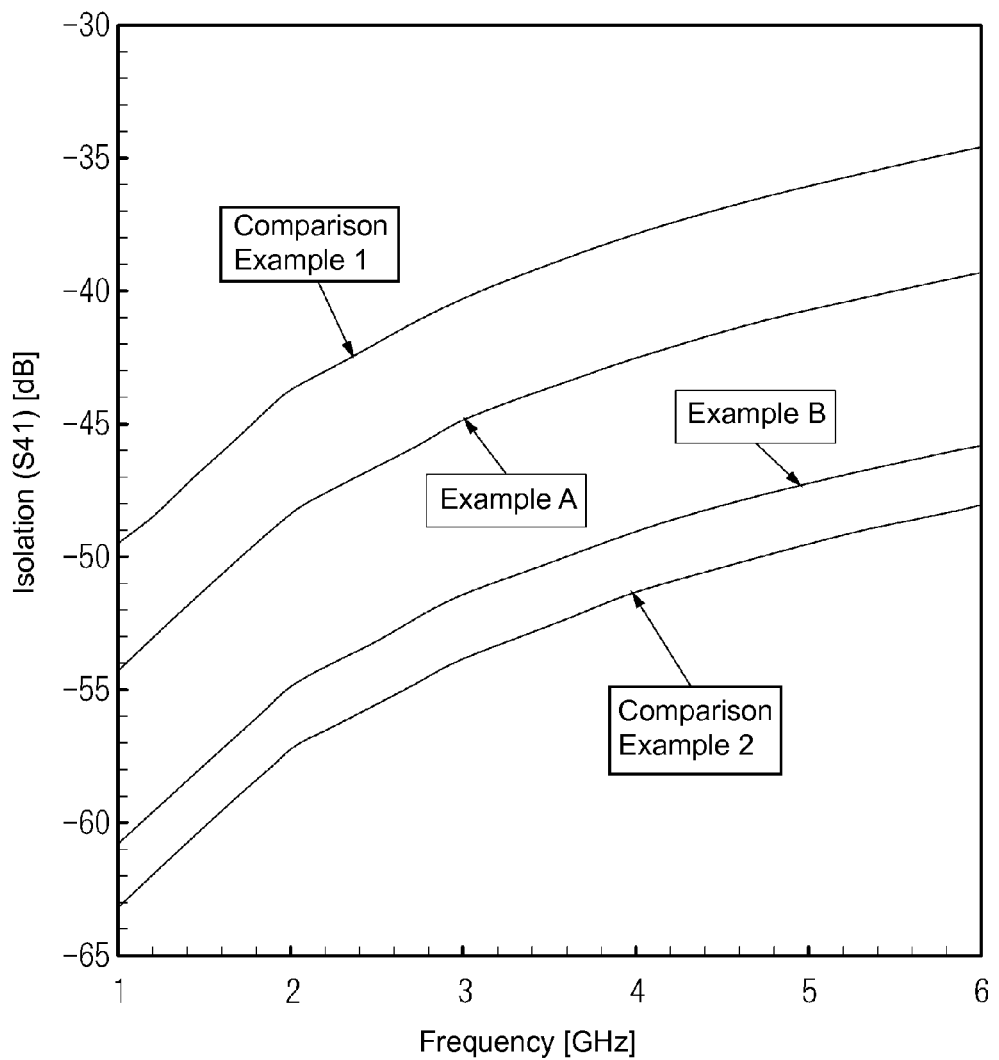
FIG. 4 shows isolation simulation results of Examples A and B.
Figure 6:
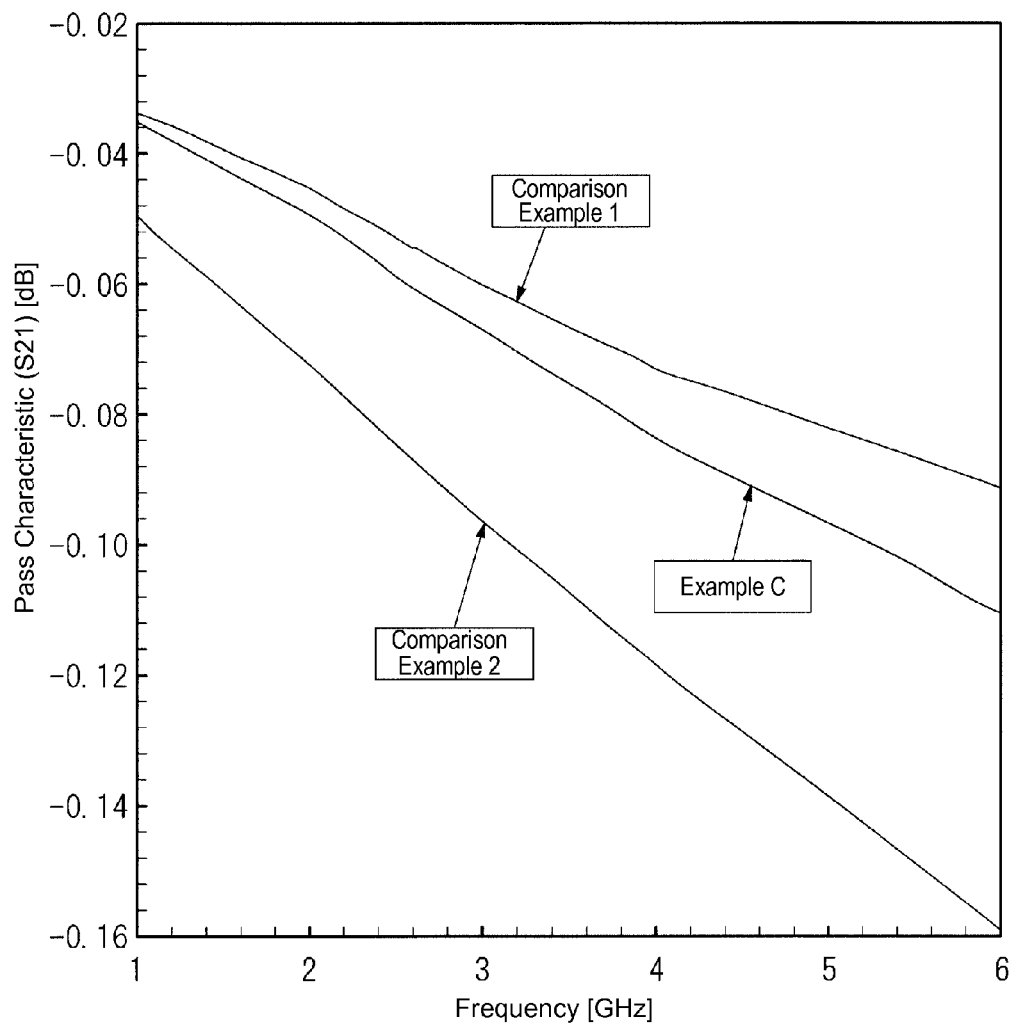
FIG. 6 shows results from pass characteristic simulations of Example C, which is an example of Embodiment 3.
Figure 7:
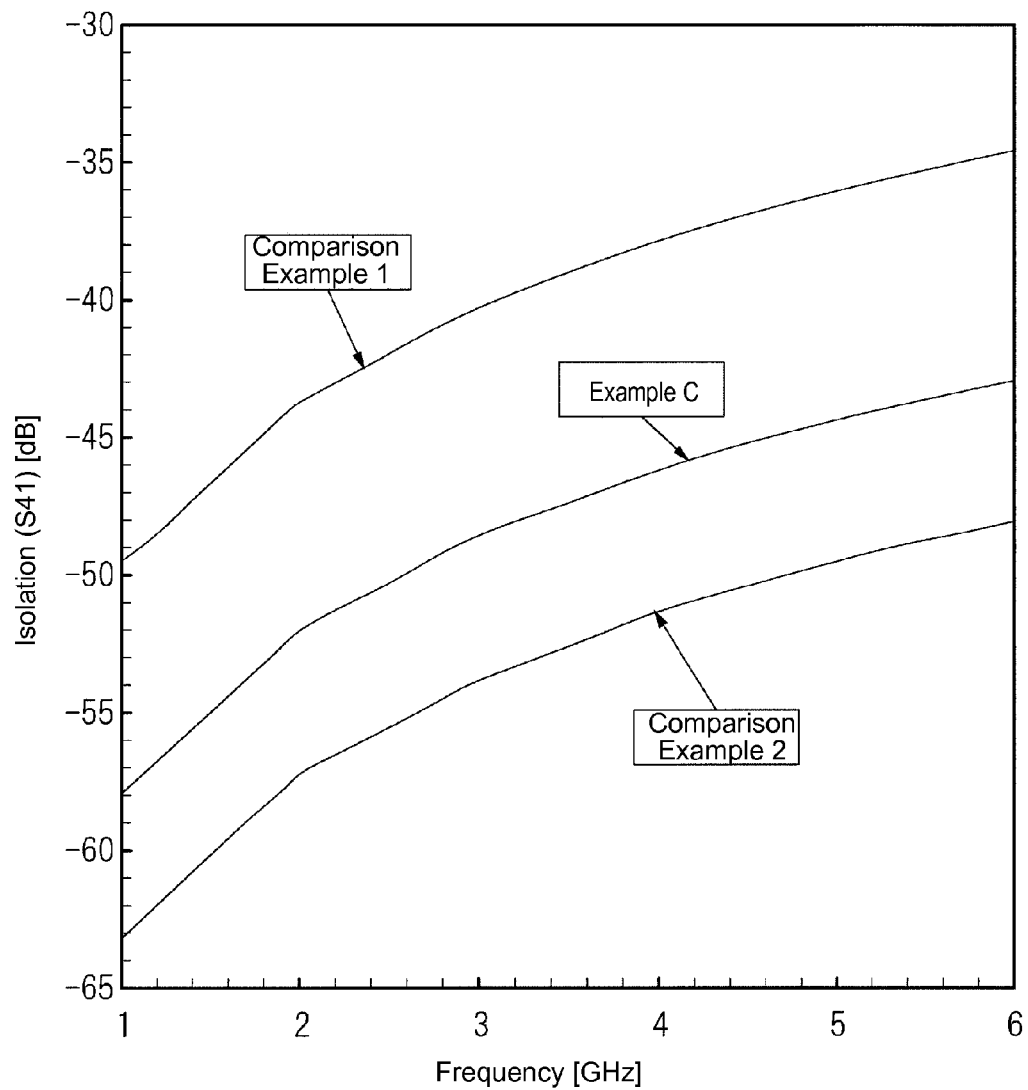
FIG. 7 shows isolation simulation results of Example C.

FIG. 3 shows results from pass characteristic simulations of Examples A and B, which are examples or Embodiments 1 and 2, respectively, and FIG. 4 shows isolation simulation results of Examples A and B. FIG. 6 shows results from pass characteristic simulations of Example C, which is an example of Embodiment 3, and FIG. 7 shows isolation simulation results of Example C. As shown in these figures, according to these examples of the present invention, the pass characteristics, when compared with Comparison Example 1, are slightly inferior, whereas isolation is markedly improved. On the other hand, when compared with Comparison Example 2, isolation is inferior, whereas the pass characteristics are confirmed to be very advantageous. If using a coplanar line such as in Comparison Example 2 when designing a realistic high frequency circuit, the width of the signal line becomes smaller than the microstrip line, resulting in an increase of damage to the conductor and a large passing loss. Achieving a uniform characteristic impedance requires a high degree of processing accuracy, and thus, is not realistic when an increase in density, a narrower pitch, and a reduction in thickness are needed. Accordingly, Comparison Example 1 is a realistic comparative target for the present invention, and as described above, while the pass characteristics are slightly inferior, the isolation is good and verified to be very useful when an increase in density, a narrower pitch, and a reduction in thickness are needed.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A multilayer circuit substrate formed by stacking insulating layers and conductive layers, comprising:
   a first signal line and a first ground conductor spaced apart from the first signal line formed in a first conductive layer; and
   a second signal line and a second ground conductor spaced apart from the second signal line formed in a second conductive layer, the second conductive layer facing the first conductive layer across an insulating layer,
   wherein the first signal line intersects the second signal line in a plan view of the multilayer circuit substrate,
   wherein a space between the first ground conductor and first signal line is smaller in an intersection area of the first and second signal lines than a space in a non-intersection area,
   wherein a space between the second ground conductor and second signal line is smaller in the intersection area than a space in the non-intersection area,
   wherein the first signal line is formed at a smaller line width in the intersection area than in the non-intersection area,
   wherein the second signal line has the same line width throughout the intersection area and the non-intersection area,
   wherein in the non-intersection area, in the plan view, the first signal line in the first conductive layer is disposed directly above the second ground conductor in the second conductive layer, and
   wherein in the non-intersection area, in the plan view, the second signal line in the second conductive layer is disposed directly under the first ground conductor in the first conductive layer.

2. The multilayer circuit substrate according to claim 1, wherein the space between the first ground conductor and first signal line is set such that, in the intersection area of the first and second signal lines, the first ground conductor contributes more to characteristic impedance of the first signal line than the second ground conductor, and in the non-intersection area the distance with the second ground conductor contributes more than the distance with the first ground conductor, and
   wherein the space between the second ground conductor and second signal line is set such that, in the intersection area of the first and second signal lines, the second ground conductor contributes more to characteristic impedance of the second signal line than the first ground conductor, and in the non-intersection area the first ground conductor contributes more to characteristic impedance than the second ground conductor.

3. The multilayer circuit substrate according to claim 1, wherein the first signal line forms part of a coplanar line together with the first ground conductor at the intersection area, and forms part of a microstrip line together with the second ground conductor underneath at the non-intersection area, and
   wherein the second signal line forms part of a coplanar line together with the second ground conductor at the intersection area, and forms part of a microstrip line together with the first ground conductor thereabove at the non-intersection area.

4. The multilayer circuit substrate according to claim 2, wherein the first signal line forms part of a coplanar line together with the first ground conductor at the intersection area, and forms part of a microstrip line together with the second ground conductor underneath at the non-intersection area, and
   wherein the second signal line forms part of a coplanar line together with the second ground conductor at the intersection area, and forms part of a microstrip line together with the first ground conductor thereabove at the non-intersection area.

5. The multilayer circuit substrate according to claim 1, wherein the first signal line has the same characteristic impedance in the non-intersection area as in the intersection area of the first signal line and the second signal line, and
   wherein the second signal line has the same characteristic impedance in the non-intersection area as in the intersection area of the first signal line and the second signal line.

6. The multilayer circuit substrate according to claim 2, wherein the first signal line has the same characteristic impedance in the non-intersection area as in the intersection area of the first signal line and the second signal line, and
   wherein the second signal line has the same characteristic impedance in the non-intersection area as in the intersection area of the first signal line and the second signal line.

7. The multilayer circuit substrate according to claim 3, wherein the first signal line has the same characteristic impedance in the non-intersection area as in the intersection area of the first signal line and the second signal line, and
   wherein the second signal line has the same characteristic impedance in the non-intersection area as in the intersection area of the first signal line and the second signal line.

8. The multilayer circuit substrate according to claim 4, wherein the first signal line has the same characteristic impedance in the non-intersection area as in the intersection area of the first signal line and the second signal line, and
   wherein the second signal line has the same characteristic impedance in the non-intersection area as in the intersection area of the first signal line and the second signal line.

* * * * *